United States Patent
Tamura et al.

(10) Patent No.: US 8,421,452 B2
(45) Date of Patent: Apr. 16, 2013

(54) CURRENT SENSOR AND BATTERY WITH CURRENT SENSOR

(75) Inventors: Manabu Tamura, Miyagi-Ken (JP); Masaru Koishi, Miyagi-Ken (JP); Masatoshi Nomura, Miyagi-Ken (JP); Hiroyuki Hebiguchi, Miyagi-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 314 days.

(21) Appl. No.: 13/020,764

(22) Filed: Feb. 3, 2011

(65) Prior Publication Data
US 2011/0199079 A1    Aug. 18, 2011

(30) Foreign Application Priority Data
Feb. 12, 2010    (JP) .................. 2010-029287

(51) Int. Cl.
*G01R 33/09*    (2006.01)
*H02J 7/02*    (2006.01)
*H02J 7/04*    (2006.01)

(52) U.S. Cl.
USPC ........................ 324/252; 320/162; 320/165

(58) Field of Classification Search .................. 324/252; 320/162, 165
See application file for complete search history.

(56) References Cited

FOREIGN PATENT DOCUMENTS
| JP | 55-101057 | | 8/1980 |
|---|---|---|---|
| JP | 2008215970 A | * | 9/2008 |
| JP | 2009-168644 | | 7/2009 |

OTHER PUBLICATIONS

Partial Translation of JP-2008215970A, Sep. 2008.*

* cited by examiner

*Primary Examiner* — Bot Ledynh
(74) *Attorney, Agent, or Firm* — Beyer Law Group LLP (57) ABSTRACT

A current sensor includes a magnetic detection element having a resistance value changed by applying inductive magnetic field from measurement target current, a magnetic core provided in the vicinity of the magnetic detection element, and a coil generating magnetic field attenuating the inductive magnetic field. A constant level current in a predetermined range of output voltage of the magnetic detection element flows in the coil, and the measurement target current is detected on the basis of the output voltage of the magnetic detection element.

6 Claims, 8 Drawing Sheets

COIL CURRENT
(CASE OF $A_1(=0)$)

FIG. 3B

COIL CURRENT
(CASE OF $A_2$)

CURRENT SENSOR AND BATTERY WITH CURRENT SENSOR

CLAIM OF PRIORITY

This application claims benefit of Japanese Patent Application No. 2010-029287 filed on Feb. 12, 2010, which is hereby incorporated by reference.

BACKGROUND OF THE INVENTION

1. Field of the Invention

The present invention relates to a magnetic proportional current sensor including a magnetic core and a battery provided with the current sensor.

2. Description of the Related Art

In electric vehicles, a motor is driven using electricity stored in a secondary battery, and magnitude of motor driving current is detected by, for example, a current sensor. An example of the current sensor is a magnetic equilibrium current sensor (e.g., Japanese Unexamined Patent Application Publication No. 55-101057 and 2009-168644).

In the magnetic equilibrium current sensor, when measurement target current flows in a primary conductor, output voltage is generated in a magnetic detection element by primary magnetic field according to the measurement target current, a voltage signal output from the magnetic detection element is converted into current, and the current flows in a secondary conductor formed of a coil (negative feedback). The magnetic equilibrium current sensor is operated such that magnetic field (cancel magnetic field) generated by the current flowing in the secondary conductor and magnetic field generated by the measurement target current cancel each other out to be constantly 0. In this case, the current flowing in the secondary conductor is converted into voltage and is taken out as an output.

However, in the magnetic equilibrium current sensor, it is necessary that the voltage signal output from the magnetic detection element is converted into the current, the current is fed back to cancel magnetic field generated by the measurement target current, current ($\tau=L/R$) of a coil as the secondary conductor is converted into voltage, and the voltage is taken out as an output. Accordingly, there is a problem that a response rate of current detection is lowered.

SUMMARY OF THE INVENTION

An advantage of some aspects of the invention is to provide a current sensor with a high response rate of current detection.

According to an aspect of the invention, there is provided a current sensor including: a magnetic detection element having a resistance value changed by applying inductive magnetic field from measurement target current; a magnetic core provided in the vicinity of the magnetic detection element; and a coil generating magnetic field attenuating the inductive magnetic field, wherein a constant level current in a predetermined range of output voltage of the magnetic detection element flows in the coil, and the measurement target current is detected on the basis of the output voltage of the magnetic detection element.

In the current sensor according to the aspect of the invention, it is preferable that when the output voltage of the magnetic detection element is over the predetermined range, the constant level current is gradually changed such that the output voltage is kept in the predetermined range.

In the current sensor according to the aspect of the invention, it is preferable to further include a signal processing unit monitoring the output voltage of the magnetic detection element, and a current control unit gradually changing a current value flowing in the coil on the basis of a signal of the signal processing unit to keep the output voltage in the predetermined range when the output voltage of the magnetic detection element is over the predetermined range.

In the current sensor according to the aspect of the invention, it is preferable that the magnetic detection element is a magnetoresistance effect element.

In the current sensor according to the aspect of the invention, it is preferable that the current value flowing in the coil is determined according to a degree of change of the output voltage of the magnetic detection element.

According to another aspect of the invention, there is provided a battery including the current sensor.

According to the aspect of the invention, in the current sensor including the magnetic detection element having the resistance value changed by applying the inductive magnetic field from the measurement target current, the magnetic core provided in the vicinity of the magnetic detection element, and the coil generating the magnetic field attenuating the inductive magnetic field, the constant level current according to the magnitude of the measurement target current flows in the coil in the predetermined range of the output voltage of the magnetic detection element, the measurement target current is detected on the basis of the output voltage of the magnetic detection element, and thus it is possible to detect current at a high response rate as compared with a magnetic equilibrium current sensor. In addition, since the output voltage from the magnetic detection element can be in the predetermined range, it is possible to detect the measurement target current with high precision.

DESCRIPTION OF THE PREFERRED EMBODIMENTS

Hereinafter, embodiments of the invention will be described in detail with reference to the accompanying drawings.

Figure 1:
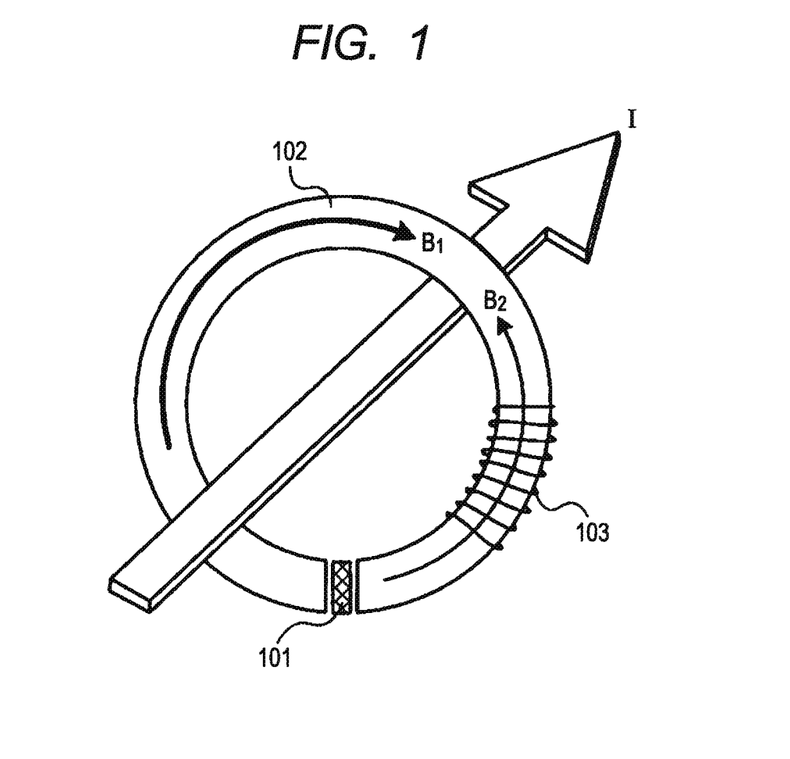
FIG. 1 is a diagram illustrating an example of a current sensor according to an embodiment of the invention.

A current sensor shown in FIG. 1 includes a magnetic detection element 101 having a resistance value changed by applying inductive magnetic field from measurement target current I, a magnetic core 102 provided in the vicinity of the magnetic detection element 101, and a coil 103 generating magnetic field attenuating the inductive magnetic field from the measurement target current I.

The magnetic detection element 101 may be a magnetoresistance effect element such as a TMR element (tunnel magnetoresistance effect element) and a GMR element (giant magnetoresistance effect element), and a magnetic sensor such as a hall element and a hall IC. Particularly, using the magnetoresistance effect element, it is possible to raise the response rate of current detection.

The magnetic core 102 may be provided around a conductor in which the measurement target current I flows and the coil 103 may be provided around the magnetic core 102. The magnetic detection element 101 may be provided in a gap portion of the magnetic core 102.

As shown in FIG. 1, the current sensor has the coil 103 in the same manner as the magnetic equilibrium current sensor, but constant level current in a predetermined range (threshold value) of the output voltage of the magnetic detection element 101 flows in the coil 103, and the current sensor has a magnetic proportional configuration of detecting the measurement target current on the basis of the output voltage of the magnetic detection element 101. That is, in the current sensor of the embodiment, it is not that current canceling the magnetic field generated by the measurement target current I is constantly allowed to flow in the coil 103 to be zero and the measurement target current I is measured on the basis of the coil current, but the measurement target current is measured on the basis of the output voltage from the magnetic detection element 101. A constant level current value according to magnitude of the measurement target current I (magnetic field B1) is set for the coil 103 such that the output voltage of the magnetic detection element 101 is kept in a predetermined range.

As described above, the measurement target current is measured on the basis of the output voltage from the magnetic detection element 101, the response rate of the magnetic detection element 101 becomes a response rate with respect to current, and thus it is possible to detect current at a high response rate as compared with the magnetic equilibrium current sensor. The constant level current value is set for the coil 103 according to the magnitude of the measurement target current I (magnetic field B1), the output voltage of the magnetic detection element 101 can be made in the predetermined range, and thus it is possible to raise detection sensitivity as compared with the proportional current sensor having no coil 103.

Next, relation between the output voltage of the magnetic detection element 101 and the constant level current flowing in the coil 103 in the current sensor according to the embodiment will be described with reference to FIG. 2.

Figure 2:
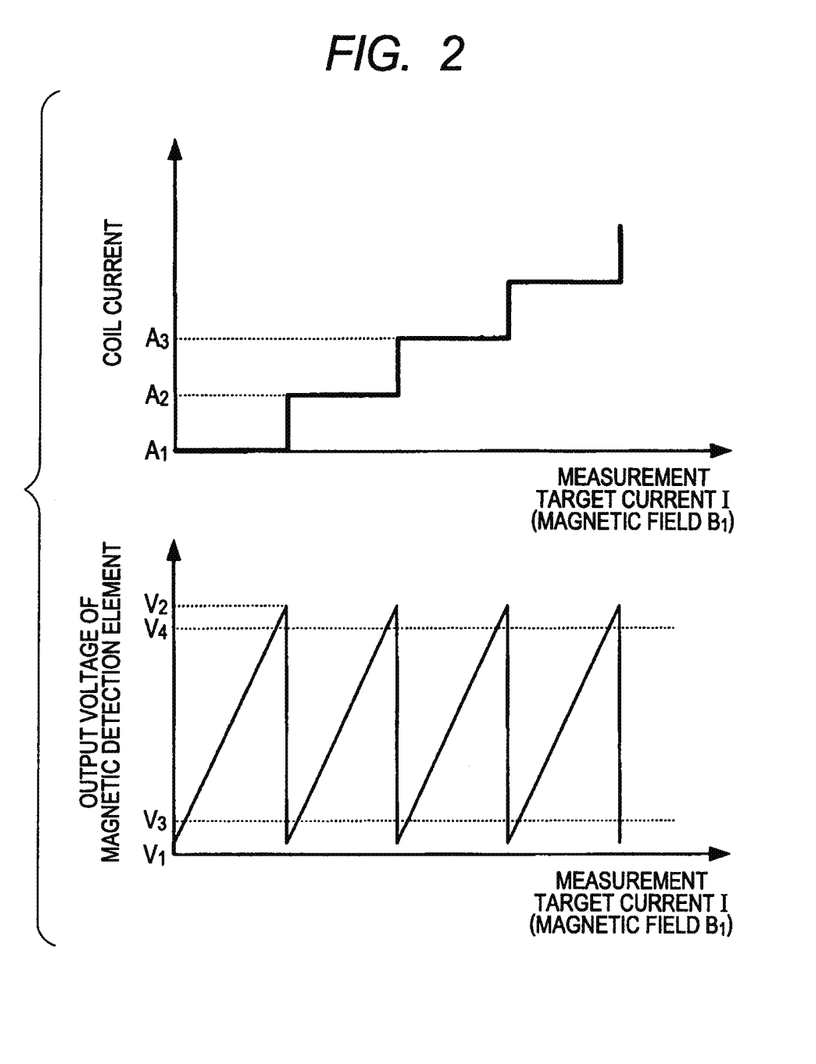
FIG. 2 is a diagram illustrating relation between output voltage and coil current of a magnetic detection element according to the embodiment of the invention.

FIG. 2 shows a case where a permissible range of the output voltage detected by the magnetic detection element 101 are set to a range of V1 to V2, and lower limit and upper limit threshold voltages of the output voltage are set to V3 and V4, respectively. A case where constant level current values (A1, A2, and A3) are set as the current values flowing in the coil 103 is shown. It is assumed that $V1<V2$, $V3<V4$, $V1 \leq V3$, and $V4 \leq V2$ are satisfied and $A1<A2<A3$ are satisfied. The value of V1 to V4 and A1 to A3 may be appropriately set according to a use type, for example, V1=0.5 V, V2=4.5 V, V3=1 V, V4=4 V, A1=0 mA, A2=5 mA, and A3=10 mA. Of course, they are not limited to these values.

In a normal state, a constant level current value (any of A1, A2, and A3) is set for the coil 103 according to a range with magnitude of the measurement target current I (magnetic field B1), and the output voltage of the magnetic detection element 101 is kept in the range of threshold values V1 to V4.

When the output voltage of the magnetic detection element 101 gets higher than the threshold voltage V4 by magnetic field from the measurement target current I, the value of the constant level current flowing in the coil 103 is gradually changed (e.g., from A1 to A2). Since magnetic field (B2) attenuating the magnetic field (B1) generated by the measurement target current I is generated (enhanced) by the increase of the current value of the coil 103, the output voltage of the magnetic detection element 101 can be kept again in the predetermined range (between V3 and V4). The constant level current value (A2) is kept in the threshold value of the output voltage of the magnetic detection element 101 in the coil 103, and them measurement target current is detected on the basis of the output voltage of the magnetic detection element 101.

When the output voltage of the magnetic detection element 101 gets lower than the threshold voltage V3 by the magnetic field from the measurement target current I, the value of the constant level current flowing in the coil 103 is changed from A2 to A1 such that the output voltage of the magnetic detection element 101 is in the predetermined range, and the output voltage of the magnetic detection element 101 is kept between V3 and V4.

That is, in the current sensor according to the embodiment, when the output voltage of the magnetic detection element 101 is in the predetermined range (between V3 and V4), the current flowing in the coil 103 is a constant value. However, when the output voltage of the magnetic detection element is over the predetermined range, the current value flowing in the coil is gradually changed such that the output voltage is in the predetermined range. The current value flowing in the conductor detected by the current sensor can be determined on the basis of the output voltage of the magnetic detection element 101 and the constant level current value set in the coil 103.

As described above, the current value flowing in the coil 103 is set to the constant level, and the output voltage from the magnetic detection element 101 is detected in the predetermined range. Accordingly, it is possible to detect the current value of the conductor with high precision and to widen the measurement-possible current range.

Since the response rage of the magnetic detection element 101 becomes a response rate to the current by detecting the current value of the conductor on the basis of the output voltage of the current detection element 101, it is possible to detect the current at the high response rate as compared with the magnetic equilibrium current sensor feeding back the output voltage of the magnetic detection element 101 as it is. For example, in the magnetic equilibrium current sensor in the related art, when magnetic permeability of the magnetic core is 50, a radius of the coil is 1 mm, a length of the coil is 15 cm, and the number of coil turns is 4000, an induction coefficient L is about 20 mH. When resistance of the current-voltage conversion is 1000Ω, a time constant is $\tau=20$ μsec, and a delay of 20 μsec occurs in the negative feedback circuit. Meanwhile, since the current sensor of the invention performing no negative feedback has no negative feedback circuit, the time constant is 0.

Figure 3A:
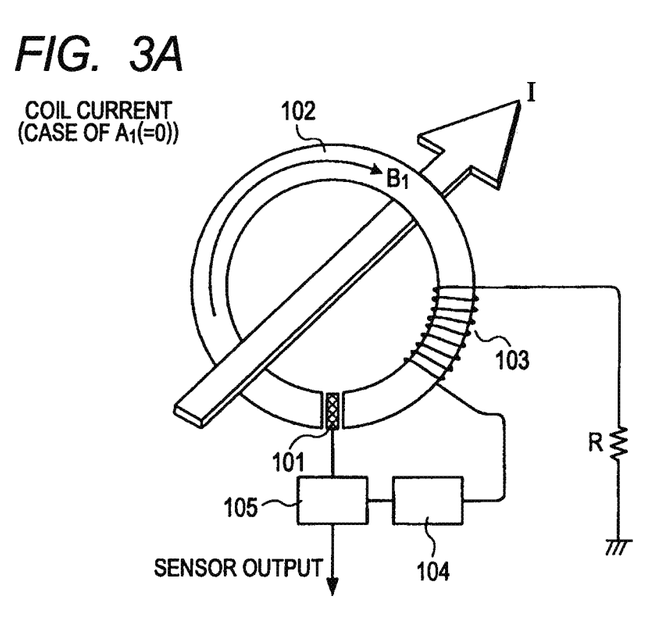
FIG. 3A and FIG. 3B are diagrams illustrating an example of a current sensor according to the embodiment of the invention.
Figure 3B:
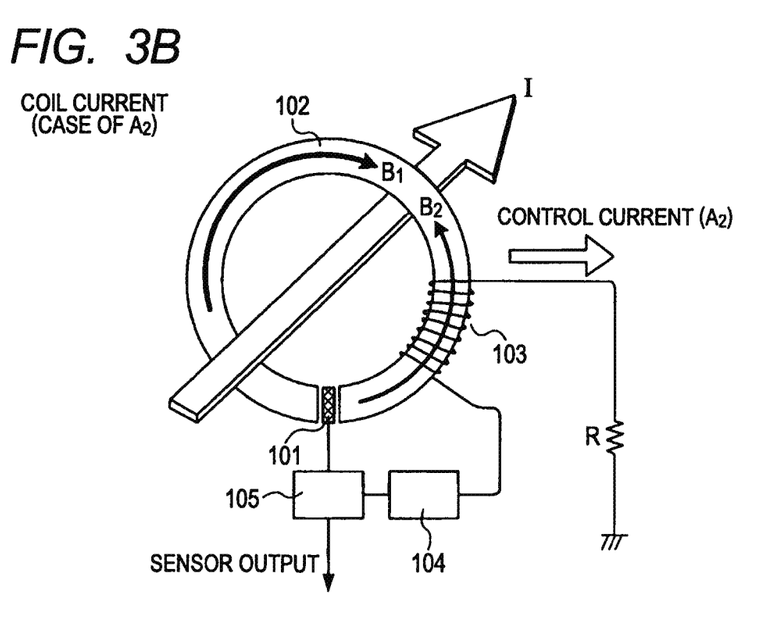

In the current sensor described above, the detection of the output voltage of the magnetic detection element 101 and the control of the constant level current value set for the coil 103 may be performed by a current control unit 104. The current control unit 104 may be provided in the current sensor, and may be provided in an external device connected to the current sensor. FIG. 3A and FIG. 3B show an example of the current sensor provided with the current control unit 104 and a signal processing unit 105 controlling the current control unit 104.

The signal processing unit 105 outputs the current detection result of the magnetic detection element 101 and monitors the output voltage. As a result of monitoring the output voltage, when it is determined that it is necessary to change the coil current, the signal is transmitted to the current control unit 104 to control the current value of the coil 103. Specifically, the signal processing unit 105 has a function for determining whether or not the output voltage of the magnetic detection element 101 is in the predetermined range, and for changing the current level of the coil 103 when the output voltage is over the predetermined value (see FIG. 3A and FIG. 3B).

Figure 9:
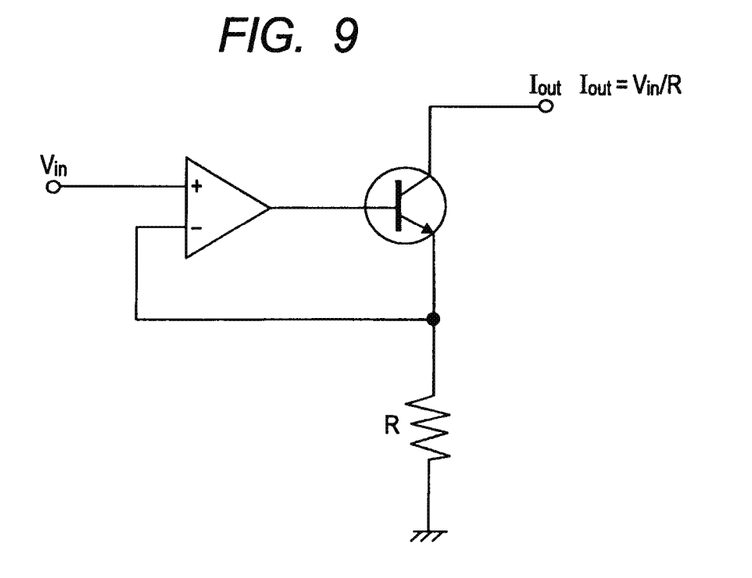
FIG. 9 is a diagram illustrating an example of a circuit configuration of a current control unit.

FIG. 9 shows an example of a circuit configuration of the current control unit 104. The current control unit 104 controls Iout by a voltage signal Vin from the signal processing unit 105. The circuit may be configured by combining an operational amplifier and a transistor. Hereinafter, an operation of the current sensor according to the embodiment will be described with reference to FIG. 4.

Figure 4:
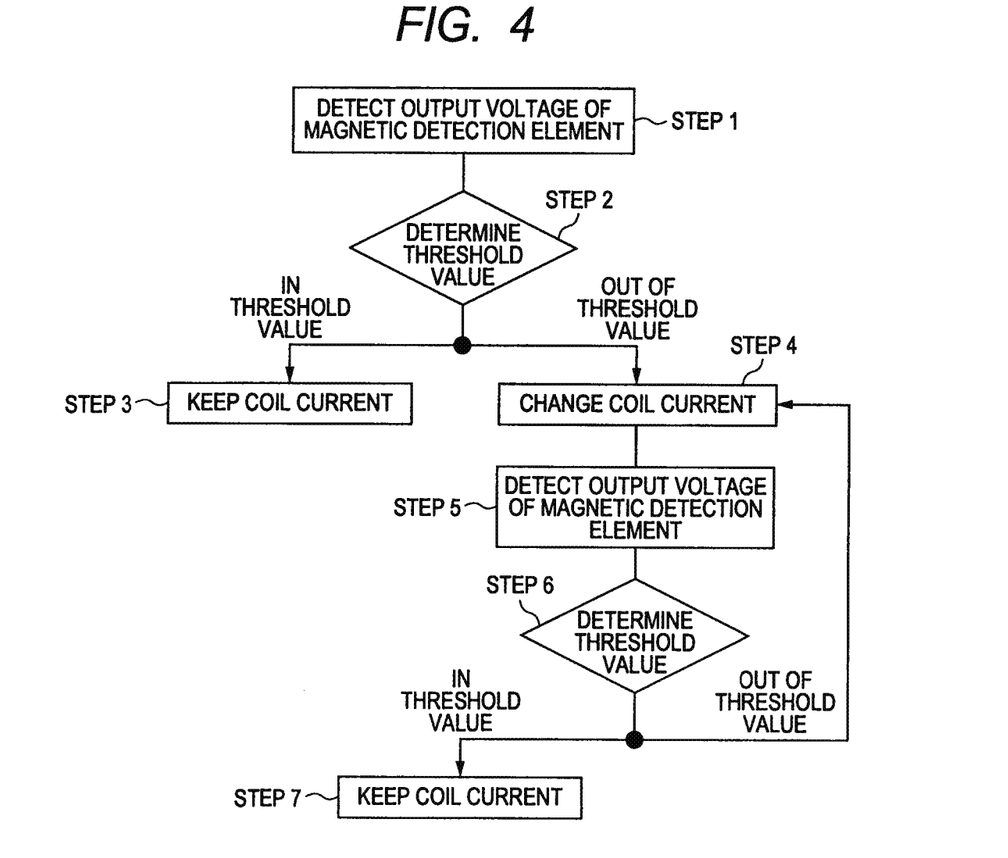
FIG. 4 is a diagram illustrating an example of an operation of a current sensor according to the embodiment of the invention.

First, when the signal processing unit 105 detects the output voltage from the magnetic detection element 101 (Step 1), it is determined whether or not the output voltage is in the predetermined range (threshold value determination) (Step 2).

In Step 2, when the output voltage of the magnetic detection element 101 is in the predetermined range, the value (e.g., A1) of the current flowing in the coil 103 is not changed and kept in low state (Step 3).

In Step 2, when the output voltage of the magnetic detection element 101 is not in the predetermined range (over the threshold value), the current value flowing in the coil 103 is gradually changed (e.g., A1→A2) (Step 4). Subsequently, the output voltage of the magnetic detection element 101 in the state of changing the current value flowing in the coil 103 to A2 is detected (Step 5), and it is determined whether or not the output voltage is in the predetermined range (threshold value detection) (Step 6).

In Step 6, when the output voltage of the magnetic detection element 101 is in the predetermined range, the current value A2 flowing in the coil 103 is kept (Step 7).

In Step 6, when the output voltage of the magnetic detection element 101 is not in the predetermined range (over the threshold value), returning to Step 4, the current value flowing in the coil 103 is further changed (e.g., A2→A3). Step 4 to Step 6 are repeated until the output voltage of the magnetic detection element 101 is in the predetermined range, thereby determining the current value flowing in the coil 103.

By the above-described operation, the current level flowing in the coil 103 can be determined according to the output voltage of the magnetic detection element 101.

Figure 5:
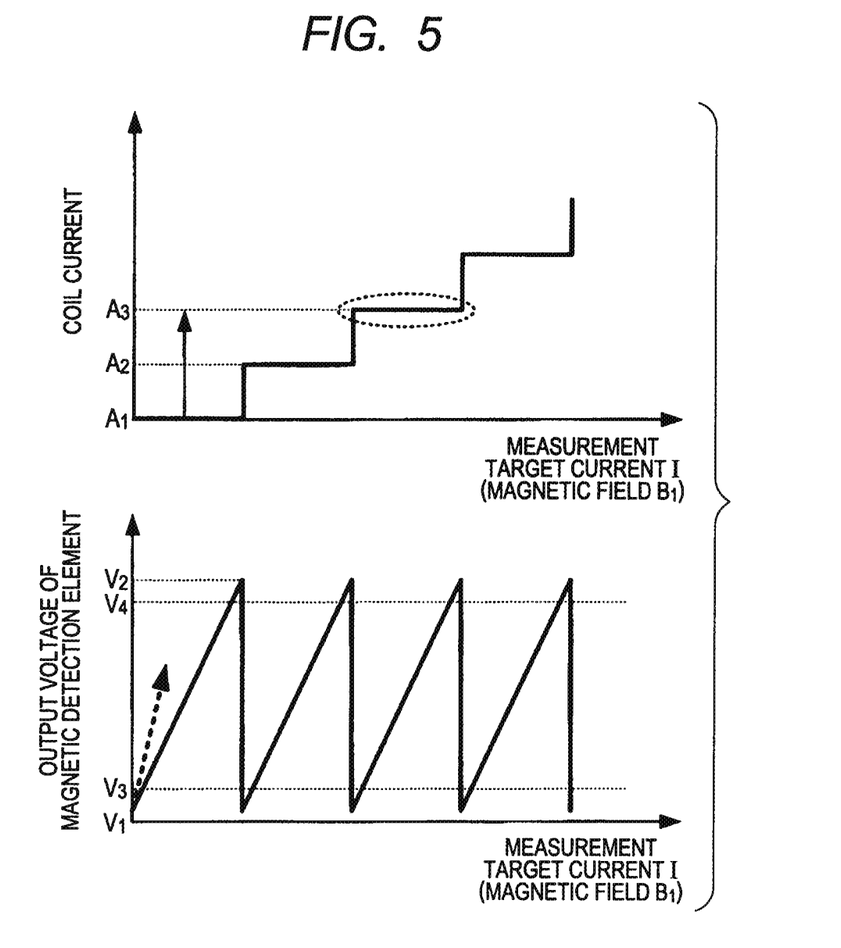
FIG. 5 is a diagram illustrating relation between output voltage and coil current of a magnetic detection element according to the embodiment of the invention.

When the output voltage of the magnetic detection element 101 is not in the predetermined range, it may be approximately measured how much magnitude of the output voltage is, and it may be determined what current level the current value flowing in the coil 103 is set to, on the basis of the measurement result. That is, when a degree of change of the output voltage of the magnetic detection element 101 is more than a predetermined value, the current value flowing in the coil 103 is not changed by one stage (one level), but is changed by two stages or more (see FIG. 5). Accordingly, even when the current flowing in the conductor is rapidly increased, the operation of repeating Step 4 to Step 6 can be omitted. Accordingly, the time of determining the current value flowing in the coil 103 is shortened, and it is possible to rapidly shift to the normal state (state where the output voltage of the magnetic detection element 101 is in the predetermined range).

Use Type of Current Sensor

Next, a case of performing management of a battery (battery management system) using the current sensor for charge and discharge control of the battery will be described.

Figure 6:
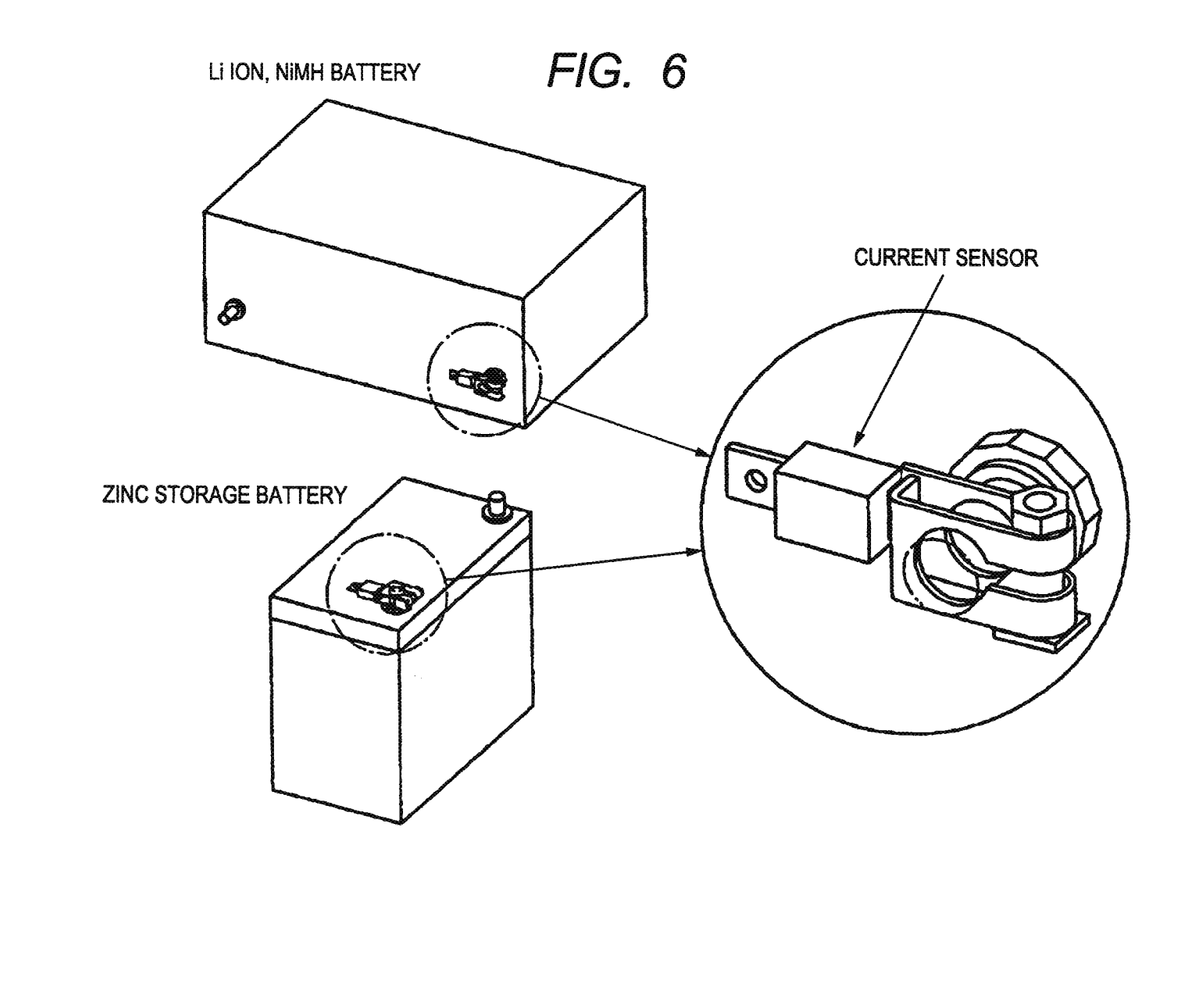
FIG. 6 is a diagram illustrating an example of a use type of applying the current sensor according to the embodiment of the invention to a battery.

The current sensor according to the embodiment is provided in a minus pole or a plus pole of a battery to perform management of the battery. Specifically, as shown in FIG. 6, the current sensor is provided in a terminal of a charging and discharging battery such as a Li ion battery, a NiMH battery, and a lead storage battery. In addition to the current sensor, a sensor for detecting voltage and temperature is provided to be a battery management system with higher precision. The amount of electric power of battery use and charge is calculated from the current value and voltage value measured by the current sensor. Change of a battery state according to change in temperature or correction of the amount of electric power may be performed. The current of charge and discharge of the battery is measured using the current sensor and integrated to manage the amount of remaining battery.

Figure 7:
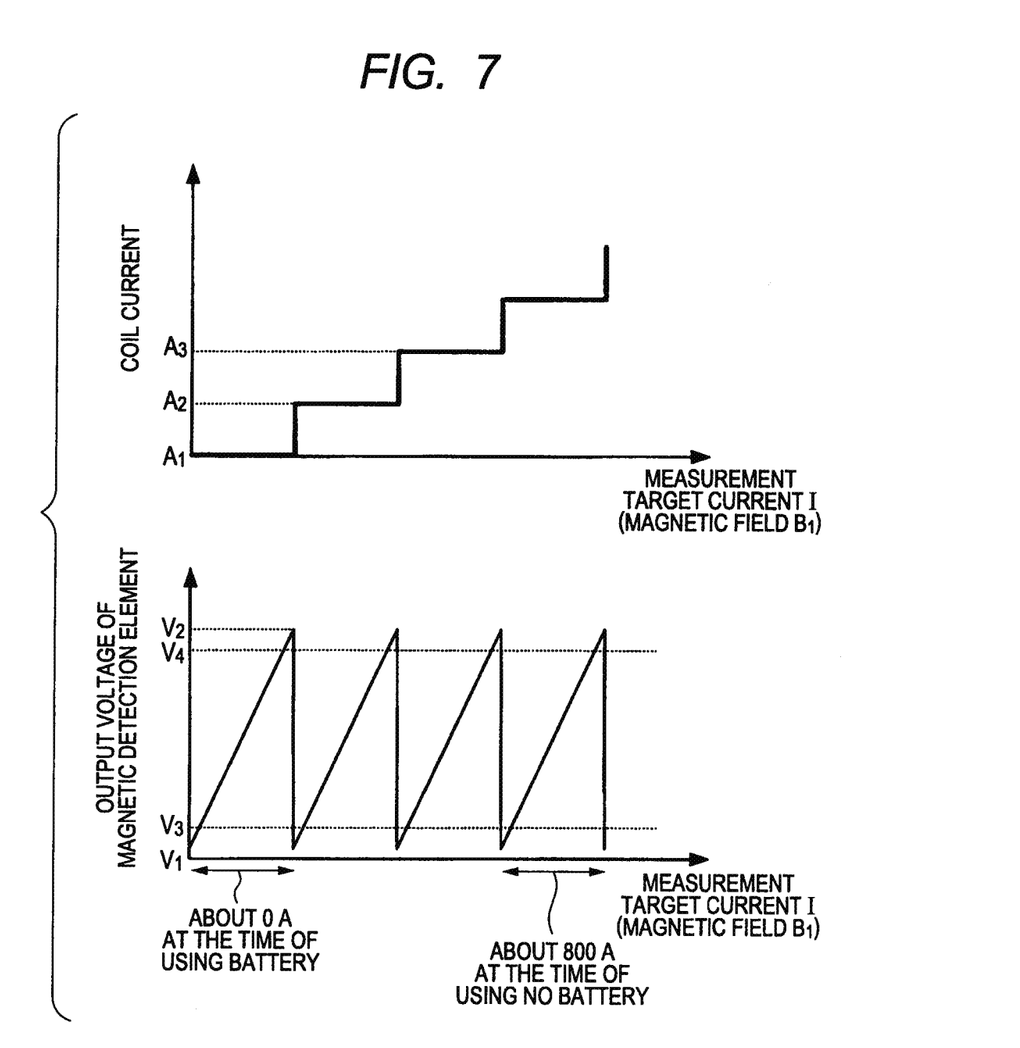
FIG. 7 is a diagram illustrating relation between output voltage and coil current of the magnetic detection element when the current sensor according to the embodiment of the invention is applied to the battery.
Figure 8:
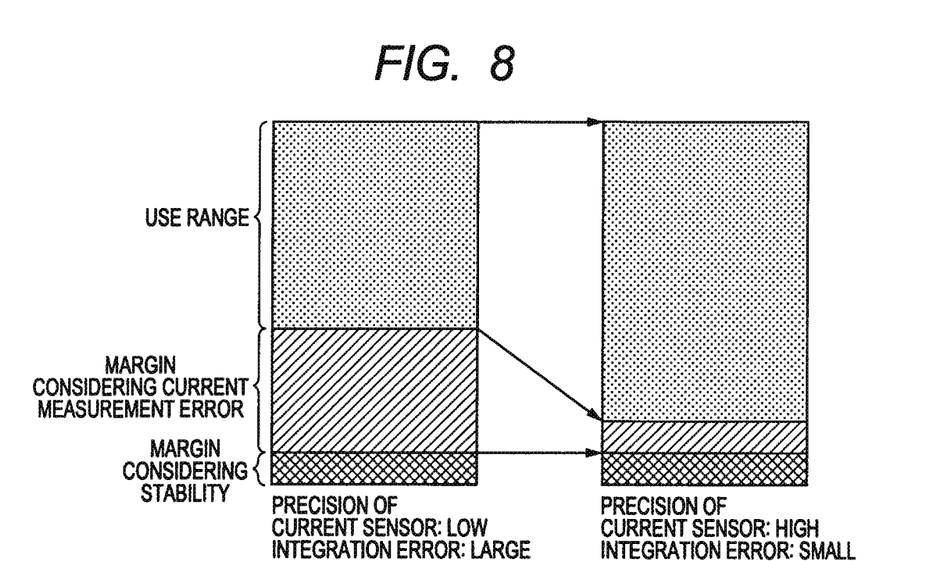
FIG. 8 is a diagram illustrating a use range of a battery when the current sensor according to the embodiment of the invention is applied to the battery.

Current values flowing at the time of using the battery and using no battery are greatly different (see FIG. 7). However, using the current sensor according to the embodiment, it is possible to detect the amount of current at the using time and non-using time by one current sensor with high precision. Since an integration error can be reduced by measuring the current value of the battery with high precision, it is possible to reduce a margin provided in the battery for overcharge and overdischarge (see FIG. 8). As a result, it is possible to efficiently use the battery, for example, it is possible to extend driving mileage by applying the current sensor according to the embodiment to the battery of electric vehicles.

The invention is not limited to the embodiment, and may be variously modified. The materials and the placement position, thickness, size, production method, and the like of the current sensor in the embodiment may be appropriately modified. In addition, the invention may be appropriately modified without deviating from the scope of the invention.

The invention is applicable to a current sensor detecting magnitude of current necessary to manage charge and discharge of a secondary battery of an electric vehicle.

It should be understood by those skilled in the art that various modifications, combinations, sub-combinations and alterations may occur depending on design requirements and other factors insofar as they are within the scope of the appended claims of the equivalents thereof.

The invention is applicable to a current sensor detecting magnitude of current.

What is claimed is:

1. A current sensor comprising:
  a magnetic detection element having a resistance value changed by applying inductive magnetic field from measurement target current;
  a magnetic core provided in the vicinity of the magnetic detection element; and
  a coil generating magnetic field attenuating the inductive magnetic field,
  wherein a constant level current in a predetermined range of output voltage of the magnetic detection element flows in the coil, and the measurement target current is detected on the basis of the output voltage of the magnetic detection element.

2. The current sensor according to claim 1, wherein when the output voltage of the magnetic detection element is over the predetermined range, the constant level current is gradually changed such that the output voltage is kept in the predetermined range.

3. The current sensor according to claim 1, further comprising a signal processing unit monitoring the output voltage of the magnetic detection element, and a current control unit gradually changing a current value flowing in the coil on the basis of a signal of the signal processing unit to keep the output voltage in the predetermined range when the output voltage of the magnetic detection element is over the predetermined range.

4. The current sensor according to claim 1, wherein the magnetic detection element is a magnetoresistance effect element.

5. The current sensor according to claim 1, wherein the current value flowing in the coil is determined according to a degree of change of the output voltage of the magnetic detection element.

6. A battery comprising the current sensor according to claim 1.

* * * * *